US012777636B2

(12) United States Patent
Hou

(10) Patent No.: US 12,777,636 B2
(45) Date of Patent: Oct. 27, 2026

(54) SEMICONDUCTOR DEVICE AND MANUFACTURE METHOD THEREOF

(71) Applicant: NANYA TECHNOLOGY CORPORATION, New Taipei City (TW)

(72) Inventor: Szu Yu Hou, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 305 days.

(21) Appl. No.: 18/777,897

(22) Filed: Jul. 19, 2024

(65) Prior Publication Data

US 2026/0025984 A1 Jan. 22, 2026

(51) Int. Cl.
*H10B 12/00* (2023.01)

(52) U.S. Cl.
CPC .......... *H10B 12/485* (2023.02); *H10B 12/02* (2023.02)

(58) Field of Classification Search
None
See application file for complete search history.

(56) References Cited

U.S. PATENT DOCUMENTS

2005/0042823 A1* 2/2005 Chen .................... H10D 1/712 257/E21.018
2010/0148301 A1* 6/2010 Matsuda ............... C23C 16/308 257/E21.546
2011/0143532 A1* 6/2011 Bai .................... H10B 12/0335 438/669
2012/0009787 A1* 1/2012 Kim ..................... H10B 12/053 438/691
2019/0081047 A1* 3/2019 Feng ...................... H10B 12/03
2021/0035984 A1* 2/2021 Ji ........................ H10B 12/0335
2022/0059543 A1* 2/2022 Mun .................... H10B 12/315
2022/0102353 A1* 3/2022 Kim ................... H10B 12/0335
2022/0344341 A1* 10/2022 Kim ................... H10B 12/0335

* cited by examiner

*Primary Examiner* — Bilkis Jahan
(74) *Attorney, Agent, or Firm* — CKC & Partners Co., LLC

(57) ABSTRACT

A method of manufacturing a semiconductor device is provided, including: providing a substrate, including an unit area and a peripheral area; forming a cell contact, a bit line structure and a spacer on the unit area, in which the spacer separates the cell contact and the bit line structure, forming a doped polysilicon layer on the cell contact, thereby forming a cell contact structure including the doped polysilicon layer and the cell contact, in which the doped polysilicon layer is doped with a semiconductor type ion; performing a first cleaning treatment on the cell contact structure by using water; and performing a second cleaning treatment on the cell contact structure by using diluted hydrofluoric acid or the water.

20 Claims, 7 Drawing Sheets

200

100

SEMICONDUCTOR DEVICE AND MANUFACTURE METHOD THEREOF

BACKGROUND

Field of Invention

The present disclosure relates to a semiconductor device and a method of manufacturing a semiconductor device.

Description of Related Art

Semiconductor devices are widely used in the electronics industry since semiconductor devices have relatively small size, multifunctional properties, and relatively low manufacturing costs. As the distance between components gradually shrinks, the impact of residues left between components becomes significant, and the cleaning efficiency of the cleaning steps influences the electrical performance of the semiconductor devices. However, erosion may happen if the components are over-washed, causing reduction of the semiconductor devices.

For the foregoing reason, there is a need to solve the above-mentioned problem by providing a method of manufacturing a semiconductor device.

SUMMARY

Some embodiments of the present disclosure provide a method of manufacturing a semiconductor device, including: providing a substrate, including an unit area and a peripheral area; forming a cell contact, a bit line structure and a spacer on the unit area, in which the spacer separates the cell contact and the bit line structure, forming a doped polysilicon layer on the cell contact, thereby forming a cell contact structure including the doped polysilicon layer and the cell contact, in which the doped polysilicon layer is doped with a semiconductor type ion; performing a first cleaning treatment on the cell contact structure by using water; and performing a second cleaning treatment on the cell contact structure by using diluted hydrofluoric acid or the water.

In some embodiments, the second spacer structure includes a second spacer nitride layer and a second air gap embedded in the second spacer nitride layer.

In some embodiments, the cell contact and the bit line structure are partially embedded into the substrate.

In some embodiments, the bit line structure includes a first bit line and a second bit line, in which a bottom surface of the first bit line is coplanar with a top surface of the substrate, and the second bit line is partially embedded into the substrate.

In some embodiments, the first bit line includes a first bit line conductive layer, and the second bit line includes a second bit line conductive layer and a bit line contact directly contacting the second bit line conductive layer, in which the bit line contact is embedded into the substrate.

In some embodiments, the spacer includes a first spacer and a second spacer, in which the first spacer separates the first bit line and the cell contact, and the second spacer separates the second bit line and the cell contact.

In some embodiments, the step of forming the doped polysilicon layer on the cell contact includes performing an in situ-doped deposition on the cell contact to form the doped polysilicon layer.

In some embodiments, the first cleaning treatment is performed for 0.75 minute to 2 minutes.

In some embodiments, the second cleaning treatment is performed for 0.2 minute to 1.5 minute.

In some embodiments, the second cleaning treatment is performed for 0.2 minute to 0.75 minute when the second cleaning treatment is performed by the diluted hydrofluoric acid, and the second cleaning treatment is performed for 0.75 minute to 1.5 minute when the second cleaning treatment is performed by the water.

In some embodiments, the second cleaning treatment is performed by using the diluted hydrofluoric acid.

In some embodiments, the diluted hydrofluoric acid is prepared by diluting hydrofluoric acid from 250 times to 350 times with the water.

In some embodiments, the method further includes forming a barrier layer on the cell contact structure, the bit line structure and the spacer.

Some embodiments of the present disclosure provide a method of manufacturing a semiconductor device, including: providing a substrate; forming a cell contact, a bit line structure and a spacer on the substrate, in which the spacer separates the cell contact and the bit line structure, in which the bit line structure includes a first bit line and a second bit line, and a bottom surface of the first bit line is coplanar with a top surface of the substrate, and the second bit line is partially embedded into the substrate, forming a doped polysilicon layer on the cell contact, thereby forming a cell contact structure including the doped polysilicon layer and the cell contact, in which the doped polysilicon layer is doped with a semiconductor type ion; performing a first cleaning treatment on the cell contact structure by using water; and performing a second cleaning treatment on the cell contact structure by using diluted hydrofluoric acid or the water.

In some embodiments, the first bit line includes a first bit line conductive layer, and the second bit line includes a second bit line conductive layer and a bit line contact directly contacting the second bit line conductive layer, in which the bit line contact is embedded into the substrate.

In some embodiments, the spacer includes a first spacer and a second spacer, in which the first spacer separates the first bit line and the cell contact, and the second spacer separates the second bit line and the cell contact.

In some embodiments, the step of forming the doped polysilicon layer on the cell contact includes performing an in situ-doped deposition on the cell contact to form the doped polysilicon layer.

In some embodiments, the first cleaning treatment is performed for 0.75 minute to 2 minutes.

In some embodiments, the second cleaning treatment is performed for 0.2 minute to 1.5 minute.

In some embodiments, the second cleaning treatment is performed for 0.2 minute to 0.75 minute when the second cleaning treatment is performed by the diluted hydrofluoric acid, and the second cleaning treatment is performed for 0.75 minute to 1.5 minute when the second cleaning treatment is performed by the water.

In some embodiments, the method further includes forming a barrier layer on the cell contact structure, the bit line structure and the spacer.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DESCRIPTION OF THE EMBODIMENTS

Figure 1:
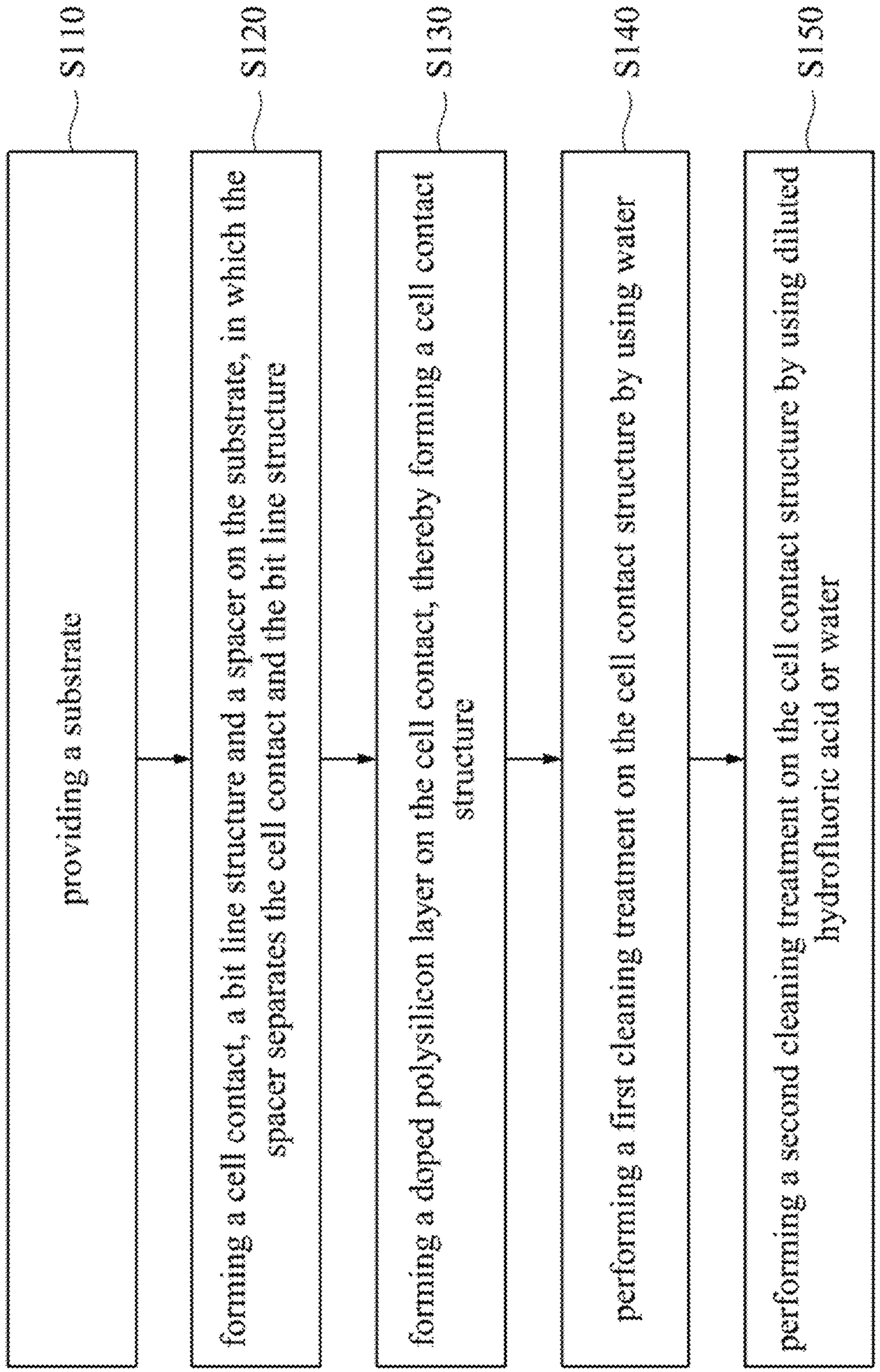
FIG. 1 is a flow diagram illustrating a method of manufacturing a semiconductor device in accordance with some embodiments.

Reference will now be made in detail to the present embodiments of the disclosure, examples of which are illustrated in the accompanying drawings. Wherever possible, the same reference numbers are used in the drawings and the description to refer to the same or like parts.

The terminology used herein is for the purpose of describing particular example embodiments only and is not intended to be limiting of the present disclosure. Single forms used in the present specification such as "a", "one" and "the" includes multiple forms such as "at least one"; "or" represents "and/or" unless described clearly. As used herein, the term "and/or" includes any and all combinations of one or more of the associated listed items. It will be further understood that the terms "comprises", "comprising", and/or "has", "have", "having" when used in this specification, specify the presence of stated features, areas, integers, steps, operations, elements, and/or components, but do not preclude the presence or addition of one or more other features, areas, integers, steps, operations, elements, components, and/or groups thereof.

Embodiments of the present disclosure are described herein with reference to top illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. Therefore, the scope of the present disclosure is to be limited only by the appended claims.

Referring to FIG. 1, illustrating a method 100 of manufacturing a semiconductor device, and the method 100 includes steps S110, S120, S130, S140 and S150. The steps S110 to S150 of FIG. 1 are elaborated in connection with following figures (FIG. 2A to FIG. 2F), providing a semiconductor device which avoids erosion and residues remaining on the cell contact structure by the specific cleaning steps, thereby increasing electrical property of the semiconductor device. It should be understood that some elements are not shown in FIG. 2A to FIG. 2F and additional elements may be included in other embodiments.

Figure 2A:
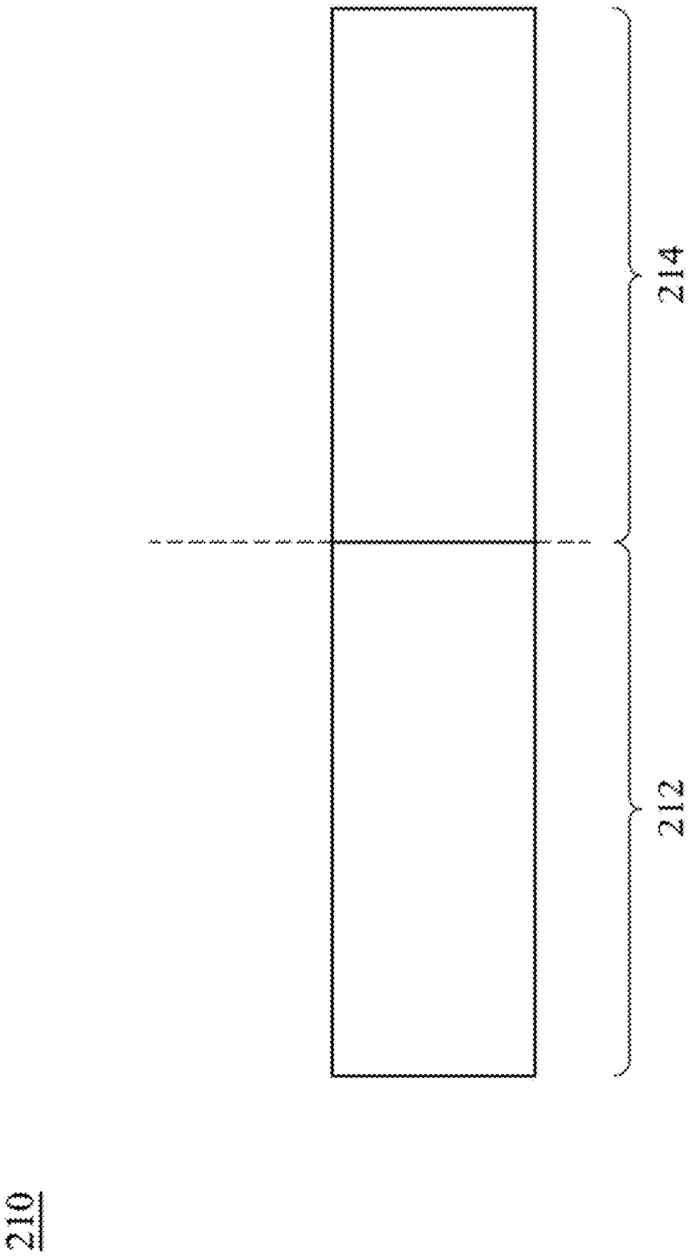
FIGS. 2A-2F are cross-sectional views of various intermediary stages in the manufacturing of a semiconductor device in accordance with some embodiments of this disclosure.

Referring to step S110 of FIG. 1 and FIG. 2A, a substrate 210 is provided.

In some embodiments, the substrate 210 includes a base material or structure on which materials are formed. In some embodiments, the substrate 210 may include a single material, multiple layers of different materials, one or more layers having regions of different materials or different structures therein, or other similar configurations. These materials may include semiconductors, insulators, conductors, or combinations thereof. In some embodiments, the substrate 210 may be a silicon substrate, a GaAs substrate, a SiGe substrate, a ceramic substrate, a quartz substrate, a glass substrate, a silicon on insulator (SOI) substrate, or the like. In some embodiments, the substrate 210 may include compound semiconductors (such as SiC, GaAs, GaP, InP, InAs or InSb) or alloy semiconductors (such as SiGe, GaAsP, AlInAs, AlGaAs, GaInAs, GaInP, or GaInAsP). In some embodiments, the substrate 210 includes a metal layer. In some embodiments, the substrate 210 is a multi-layer structure, including a polysilicon layer and a metal layer sequentially stacked on the polysilicon layer.

In some embodiments, a portion of region of the substrate 110 is doped with a specific semiconductor type dopant. For example, a portion of region is lightly doped with first conductive type ions (such as N-type dopants, for example, phosphorus, arsenic, nitrogen, etc.) and another portion of the region is lightly doped with a second conductive type ions (such as P-type dopants, for example, boron, gallium, aluminum, etc.) to assist the flow of electrons. In some embodiments, isolators made of insulation materials are embedded into the substrate 210 to define the positions of functional elements.

In some embodiments, the substrate 210 includes a unit area 212 and a peripheral area 214. In some embodiments, the unit area 212 includes source/drain regions doped with first conductive type ions or a second conductive type ions.

Figure 2B:
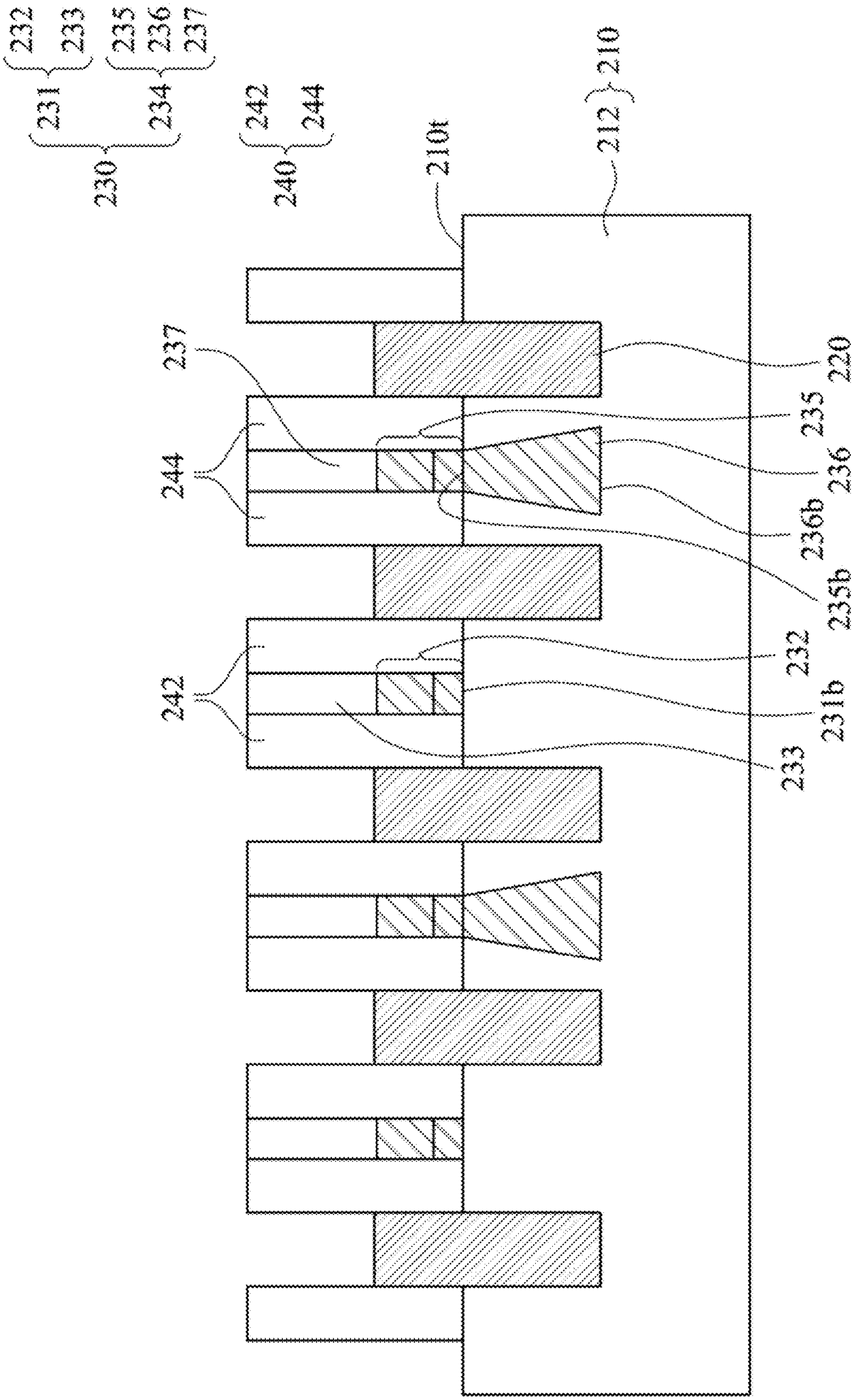

Referring to step S120 of FIG. 1 and FIG. 2B, a cell contact 220, a bit line structure 230 and a spacer 240 are formed on the substrate 210, in which the spacer 240 separates the cell contact 220 and the bit line structure 230.

In some embodiments, the cell contact 220, the bit line structure 230 and the spacer 240 are disposed on the unit area 212.

In some embodiments, the cell contact 220 and the bit line structure 230 are partially embedded into the substrate 210. In some embodiments, the bit line structure 230 includes a first bit line 231 and a second bit line 234, and a bottom surface **231*b* of the first bit line 231 is coplanar with a top surface 210*t* of the substrate 210 and directly contacting the substrate 210, and the second bit line 234 is partially embedded into the substrate 210. In detail, the first bit line 231 includes a first bit line conductive layer 232 and a first bit line nitride layer 233 disposed on the first bit line conductive layer 232, and the first bit line 231 is formed over the substrate 210 without being embedded into the substrate 210. The second bit line 234 includes a second bit line conductive layer 235, a bit line contact 236 directly contacting and disposed on the second bit line conductive layer 235 and a second bit line nitride layer 237 disposed on the second bit line conductive layer 235, in which the bit line contact 236 is completely embedded into the substrate 210, and the second bit line conductive layer 235 is formed over the bit line contact 236 without being embedded into the substrate 210. That is, a bottom surface 235*b* of the second bit line conductive layer 235 is substantially coplanar with the top surface 210t of the substrate 210, and a bottom surface 236b of the bit line contact 236 is lower than the top surface 210t of the substrate 210. In some embodiments, the bit line contact 236 is electrically connected to other circuit structures in the following procedures (not shown in the figures). In some embodiments, the first bit line conductive layer 232 and the second bit line conductive layer 235** include multiple layers of conductive materials (such as Cu, Sn, Al, W, Ag, or the like) stacked with each other, respectively.

In some embodiments, the cell contact 220 includes conductive materials. In some embodiments, the cell contact 220 includes multiple layers of conductive materials (such as Cu, Sn, Al, W, Ag, or the like) stacked with each other. In some embodiments, the bit line contact 236 and the second bit line conductive layer 235 includes conductive materials different from each other, and the materials of the first bit line conductive layer 232 are the same as which of the second bit line conductive layer 235. For example, the material of the bit line contact 236 includes Cu, and which of the second bit line conductive layer 235 and the first bit line conductive layer 232 includes W.

In some embodiments, the spacer 240 includes a first spacer 242 and a second spacer 244, in which the first spacer 242 separates the first bit line 231 and the cell contact 220, and the second spacer 244 separates the second bit line 234 and the cell contact 220. That is, the first bit line 231, the second bit line 234 and the cell contact 220 are all spaced apart from each other by the spacer 240. In some embodiments, the cell contact 220 is between the neighboring first spacer 242 and second spacer 244. In other words, the first spacer 242 and the second spacer 244 are located on the opposite sides of the cell contact 220, and the first bit line 231 and the second bit line 234 are also located on the opposite sides of the cell contact 220. Specifically, the first spacer 242 directly contacts the first bit line 231 and the cell contact 220, and the second spacer 244 directly contacts the second bit line 234 and the cell contact 220.

In some embodiments, the spacer 240 includes a spacer nitride layer (such as SiN) and a spacer oxide layer (such as SiOx), not shown in the figures, in which the spacer nitride layer and the spacer oxide layer have different etching selectivity ratios, and the spacer oxide layer is sandwiched between the spacer nitride layer.

Figure 2C:
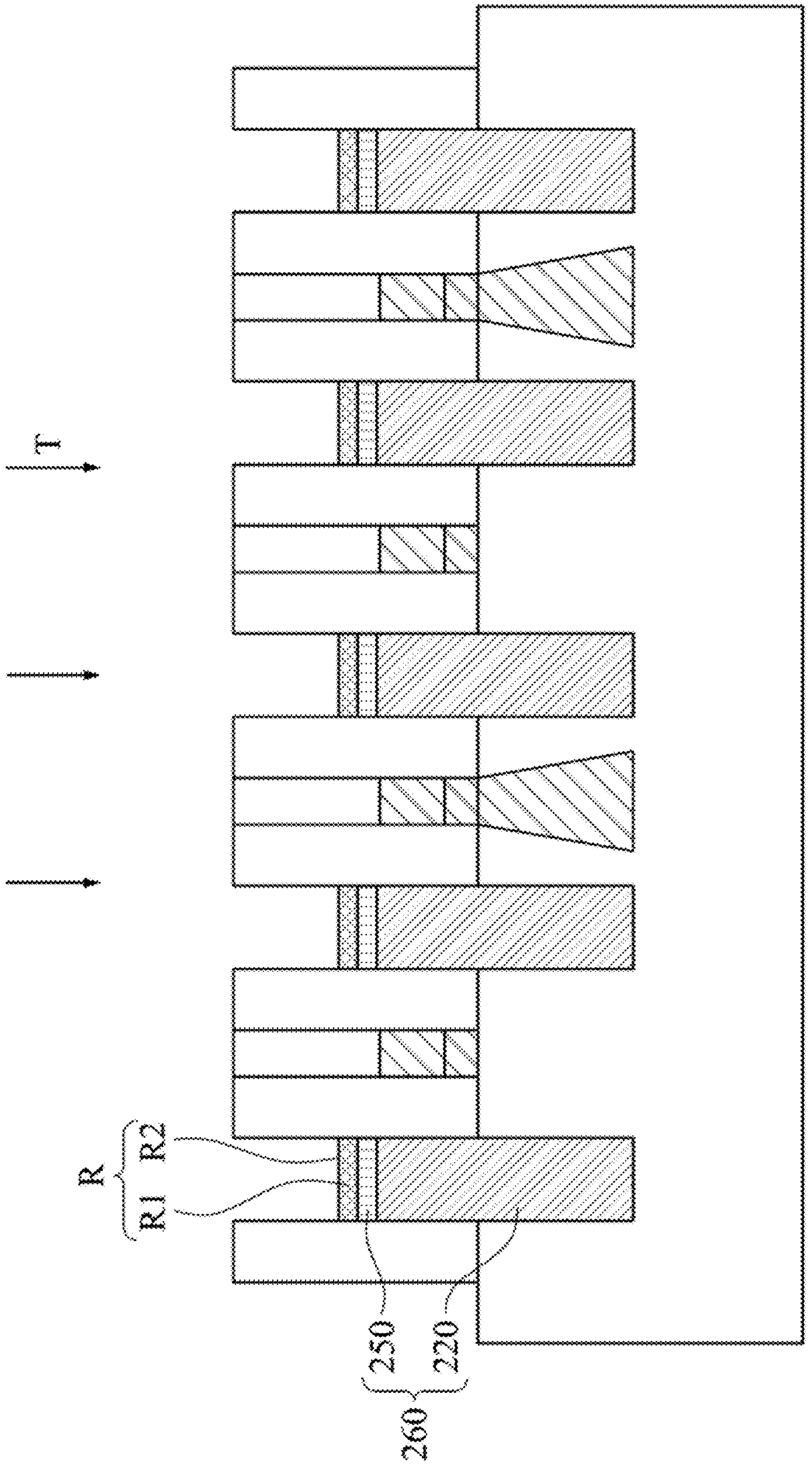

Referring to step S130 of FIG. 1 and FIG. 2C, a doped polysilicon layer 250 is formed on the cell contact 220, thereby forming a cell contact structure 260. It's noted that the disposition of the doped polysilicon layer 250 can enhance current migration of the cell contact structure 260 and improve the electrical transduction.

In some embodiments, the cell contact structure 260 includes the cell contact 220 and the doped polysilicon layer 250 directly disposed on the cell contact 220. In some embodiments, the doped polysilicon layer 250 is doped with a semiconductor type ion. That is, the doped polysilicon layer 250 includes a polysilicon layer doped with semiconductor type ions, in which the semiconductor type ions may be first conductive type ions (such as N-type dopants, for example, phosphorus, arsenic, nitrogen, etc.) or second conductive type ions (such as P-type dopants, for example, boron, gallium, aluminum, etc.). Through migration of the semiconductor type ions, electrical transduction of the cell contact structure 260 is improved.

In some embodiments, step S130 includes performing a treatment T to form the doped polysilicon layer 250. In some embodiments, the treatment T can be an in situ-doped deposition or include a polysilicon deposition and a subsequent doping procedure (doping semiconductor type ions).

In some embodiments, after the step S130, a dry etching procedure may be performed on the doped polysilicon layer 250 to control height of the doped polysilicon layer 250.

However, after the treatment T, residues R may remain on the doped polysilicon layer 250 and reduce the electrical performance of the cell contact structure 260, in which the residues R include residues R1 (the material left after the treatment T, such as polysilicon) and residues R2 (byproduct caused by the treatment T or the air, such as oxides).

Figure 2D:
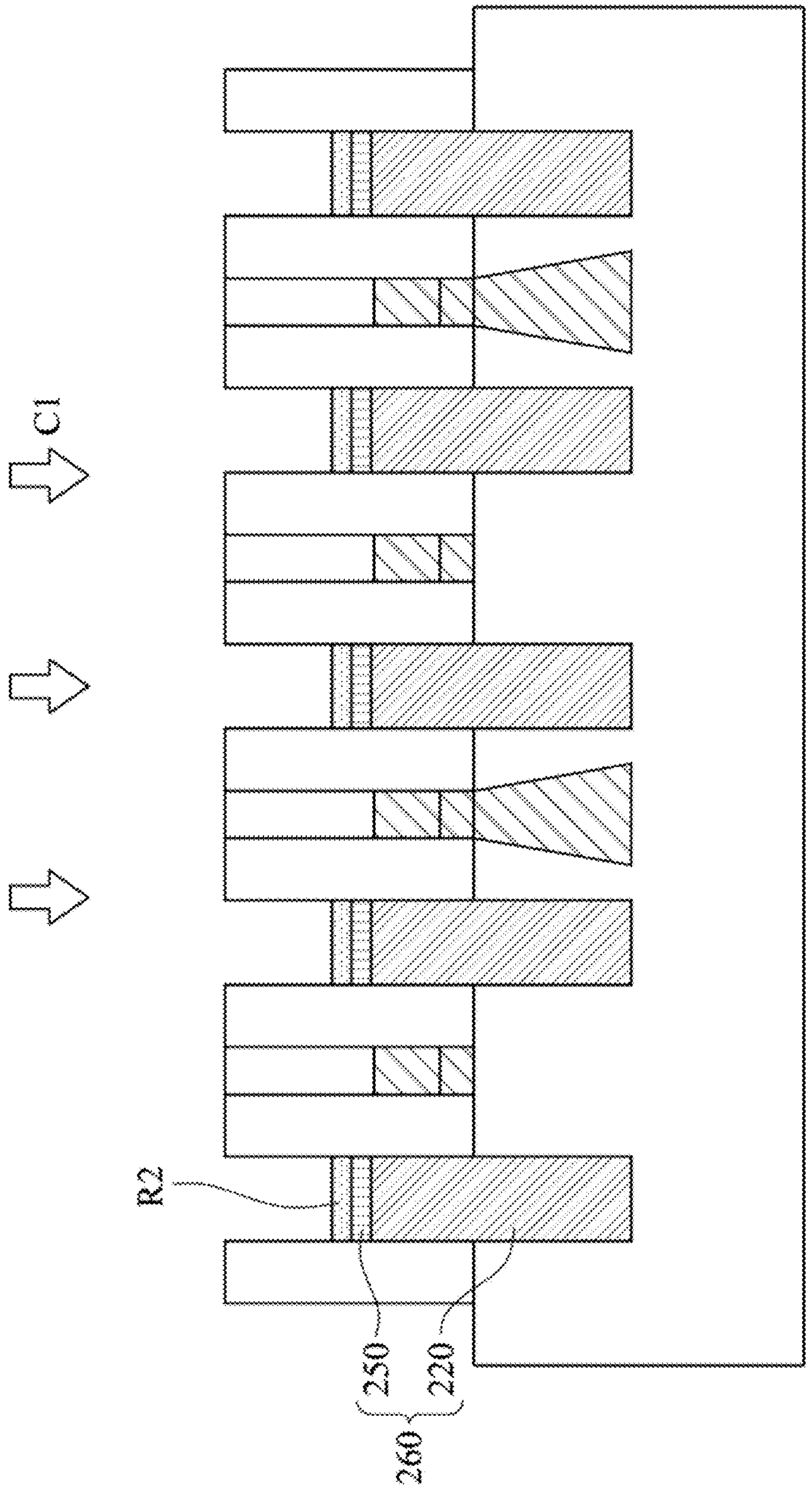

Referring to step S140 of FIG. 1 and FIG. 2D, a first cleaning treatment C1 is performed on the cell contact structure 260 by using water. Through the first cleaning treatment C1, the residues R1 (refer to FIG. 2C) is basically removed and the residues R2 remains on the doped polysilicon layer 250 since the residues R2 is hardly removed by water. It's noted that seams may exist in the doped polysilicon layer 250 if the materials used in the doped polysilicon layer 250 is much rough; therefore, compared with acid solvents (such as diluted hydrofluoric acid (DHF)), the selection of water used in the first cleaning treatment C1 to remove polysilicon avoids acid erosion of the cell contact structure 260 through the seams, thereby achieving better electrical performance (such as low resistance) of the cell contact structure 260.

In some embodiments, the first cleaning treatment C1 is performed for 0.75 minute to 2 minutes, such as 0.75 minute, 1 minute, 1.5 minute, 2 minutes, or a value within any interval defined by the above values. In the abovementioned time period, residues R1 (the material left after the treatment T, such as polysilicon) can be substantially removed, thereby achieving better cleaning efficiency with less time.

Figure 2E:
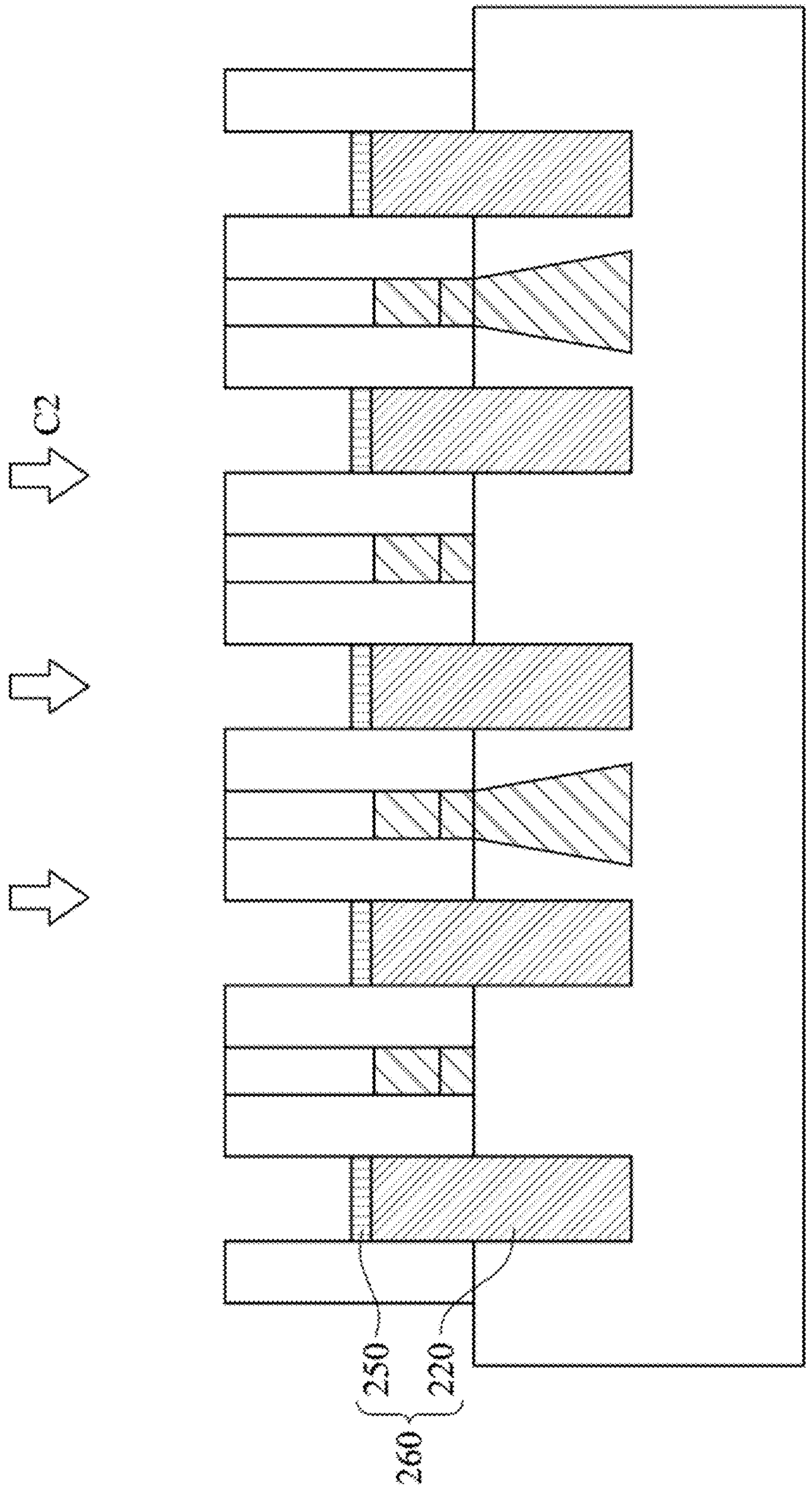

Referring to step S150 of FIG. 1 and FIG. 2E, a second cleaning treatment C2 is performed on the cell contact structure 260 by using diluted hydrofluoric acid (DHF) or water. Through the second cleaning treatment C2, the residues R2 (byproduct caused by the treatment T or the air, such as oxides) (refer to FIG. 2D) is basically removed.

It should be emphasized that comparing with two continuous cleaning procedures all by acid solvents, the cleaning treatments that the second cleaning treatment C2 (DHF or water) is performed after the first cleaning treatment C1 (water, FIG. 2D) can reduce the risks of acid erosion, thereby avoiding the disruption of the cell contact structure 260 and achieving better electrical performance (such as low resistance) of the cell contact structure 260.

Furthermore, it's noted that compared with water or other acid solvents, the selection of DHF for the second cleaning treatment C2 achieves better removal efficiency of residues R2, thereby achieving better electrical performance (such as low resistance).

In some embodiments, the second cleaning treatment C2 is performed for 0.2 minute to 1.5 minute, such as 0.2 minute, 0.25 minute, 0.5 minute, 0.75 minute, 1 minute, 1.25 minute, 1.5 minute, or a value within any interval defined by the above values. In the abovementioned time period, residues R2 (such as oxides) can be substantially removed, thereby achieving better cleaning efficiency with less time.

It's noted that compared with water, the selection of DHF for the second cleaning treatment C2 can further remove oxides caused by water provided in the first cleaning treatment C1 (FIG. 2D). If the sequence of water (first) and DHF (second) is reversed, oxides may be formed since washing by water may induce formation of oxides. Therefore, the washing sequence of water (first) and DHF (second) can achieve better removal efficiency of residues R2, thereby achieving better electrical performance (such as low resistance).

In some embodiments, the cleaning time required for DHF is less than which required for water since DHF has better removal efficiency of oxides.

For example, the second cleaning treatment C2 is performed for 0.2 minute to 0.75 minute (such as 0.2 minute, 0.25 minute, 0.5 minute, 0.75 minute, or a value within any interval defined by the above values) when the second cleaning treatment C2 is performed by DHF. If the time period is too short, the residues R2 may remain on the cell contact structure 260. If the time period is too long, the risk of acid erosion in the cell contact structure 260 is increased. In one embodiment, compared with other time periods (such as 0.5 minute (30 seconds)), the second cleaning treatment C2 for 0.25 minute (15 seconds) can achieve the better electrical performance (such as low resistance) of the cell contact structure 260 since acid erosion is reduced.

In some embodiments, the second cleaning treatment C2 is performed for 0.75 minute to 1.5 minute (such as 0.75 minute, 1 minute, 1.25 minute, 1.5 minute, or a value within any interval defined by the above values) when the second cleaning treatment C2 is performed by water. If the time period is too short, the residues R2 may remain on the cell contact structure 260. If the time period is too long, water may remain in the seams of the cell contact structure 260, thereby disrupting current transduction.

In some embodiments, DHF is prepared by diluting hydrofluoric acid (HF) from 250 times to 350 times with water for cleaning the doped polysilicon layer 250 better and avoid acid erosion. Furthermore, it's noted that compared with other dilution ratios, 300 times dilution has the better cleaning efficiency and providing better electrical performance (such as low resistance) of the cell contact structure 260.

Figure 2F:
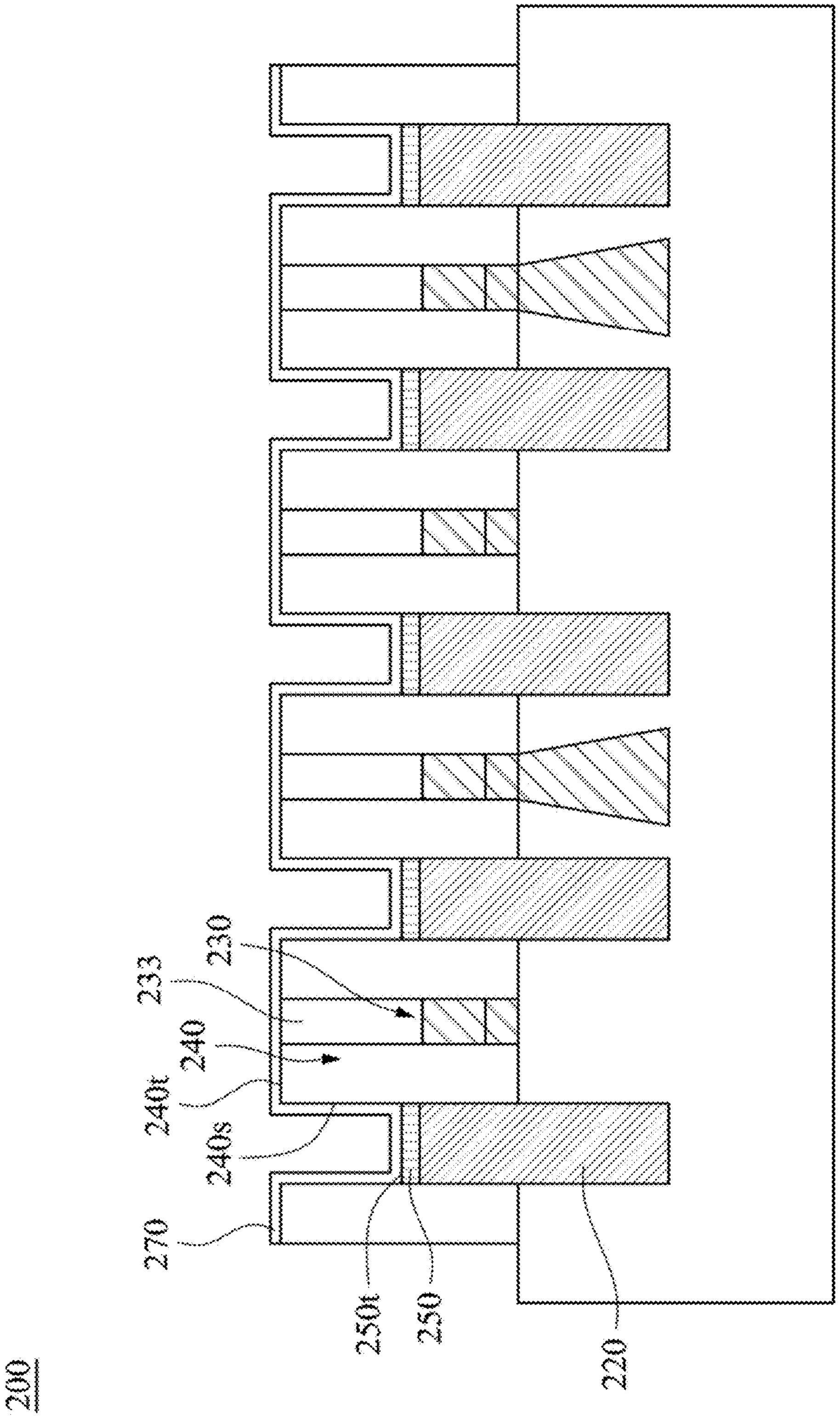

In some embodiments, please refer to FIG. 2F, the method 100 further includes forming a barrier layer 270 on the cell contact structure 260, the bit line structure 230 and the spacer 240, so as to seal and protect the cell contact structure 260, the bit line structure 230 and the spacer 240 and form a semiconductor device 200.

In some embodiments, the barrier layer 270 is conformally formed on the cell contact structure 260, the bit line structure 230 and the spacer 240. That is, the barrier layer 270 covers a top surface 250*t* of the doped polysilicon layer 250, a top surface 240*t* of the spacers 240 and side walls 240*s* of the spacers 240. In other words, in a cross-section view, the barrier layer 270 is represented as U-shape on the doped polysilicon layer 250 and side walls 240*s* of the spacers 240. In some embodiments, the barrier layer 270 is formed by an insulation material, such as SiN.

In some embodiments, before forming the barrier layer 270, the spacer oxide layer (not shown in FIG. 2F) in the spacer 240 is removed by dry etching to form air gaps (a space which may be filled with air, a gas other than air or in particular with an inert gas, or which may be a vacuum) in the spacer 240, thereby by enhancing the electrical performance. After forming the air gaps, the barrier layer 270 is then formed to seal the openings of the air gaps.

In some embodiments, after forming the barrier layer 270, cells are continuously disposed over the barrier layer 270 to form electrical devices (such as dynamic random access memory (DRAM) structures). In some embodiments, the bit line contact 236 is electrically connected to the cell by an electrical circuit, in which the electrical circuit is also connected to the cell contact structure 260 to make determine pathway of current.

Some embodiments of the present disclosure provide a method of manufacturing the semiconductor device. Through the selected solvents and the sequence of the first cleaning treatment (water) and the second cleaning treatment (water or DHF), the residues formed after the step of forming the doped polysilicon layer can be removed, and erosion of the cell contact structure can be reduced, thereby improving the electrical property (lower resistance of the cell contact structure) of the semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A method of manufacturing a semiconductor device, comprising:

providing a substrate, including an unit area and a peripheral area;

forming a cell contact, a bit line structure and a spacer on the unit area, wherein the spacer separates the cell contact and the bit line structure, forming a doped polysilicon layer on the cell contact, thereby forming a cell contact structure comprising the doped polysilicon layer and the cell contact, wherein the doped polysilicon layer is doped with a semiconductor type ion;

performing a first cleaning treatment on the cell contact structure by using water; and performing a second cleaning treatment on the cell contact structure by using diluted hydrofluoric acid or the water.

2. The method of claim 1, wherein the cell contact and the bit line structure are partially embedded into the substrate.

3. The method of claim 2, wherein the bit line structure comprises a first bit line and a second bit line, wherein a bottom surface of the first bit line is coplanar with a top surface of the substrate, and the second bit line is partially embedded into the substrate.

4. The method of claim 3, wherein the first bit line comprises a first bit line conductive layer, and the second bit line comprises a second bit line conductive layer and a bit line contact directly contacting the second bit line conductive layer, wherein the bit line contact is embedded into the substrate.

5. The method of claim 3, wherein the spacer comprises a first spacer and a second spacer, wherein the first spacer separates the first bit line and the cell contact, and the second spacer separates the second bit line and the cell contact.

6. The method of claim 1, wherein the step of forming the doped polysilicon layer on the cell contact comprises performing an in situ-doped deposition on the cell contact to form the doped polysilicon layer.

7. The method of claim 1, wherein the first cleaning treatment is performed for 0.75 minute to 2 minutes.

8. The method of claim 1, wherein the second cleaning treatment is performed for 0.2 minute to 1.5 minute.

9. The method of claim 8, wherein the second cleaning treatment is performed for 0.2 minute to 0.75 minute when the second cleaning treatment is performed by the diluted hydrofluoric acid, and the second cleaning treatment is performed for 0.75 minute to 1.5 minute when the second cleaning treatment is performed by the water.

10. The method of claim 1, wherein the second cleaning treatment is performed by using the diluted hydrofluoric acid.

11. The method of claim 1, wherein the diluted hydrofluoric acid is prepared by diluting hydrofluoric acid from 250 times to 350 times with the water.

12. The method of claim 1, further comprising forming a barrier layer on the cell contact structure, the bit line structure and the spacer.

13. A method of manufacturing a semiconductor device, comprising:

providing a substrate;

forming a cell contact, a bit line structure and a spacer on the substrate, wherein the spacer separates the cell contact and the bit line structure, wherein the bit line structure comprises a first bit line and a second bit line, and a bottom surface of the first bit line is coplanar with a top surface of the substrate, and the second bit line is partially embedded into the substrate, forming a doped polysilicon layer on the cell contact, thereby forming a cell contact structure comprising the doped polysilicon layer and the cell contact, wherein the doped polysilicon layer is doped with a semiconductor type ion;

performing a first cleaning treatment on the cell contact structure by using water; and performing a second cleaning treatment on the cell contact structure by using diluted hydrofluoric acid or the water.

14. The method of claim 13, wherein the first bit line comprises a first bit line conductive layer, and the second bit line comprises a second bit line conductive layer and a bit line contact directly contacting the second bit line conductive layer, wherein the bit line contact is embedded into the substrate.

15. The method of claim 13, wherein the spacer comprises a first spacer and a second spacer, wherein the first spacer separates the first bit line and the cell contact, and the second spacer separates the second bit line and the cell contact.

16. The method of claim 13, wherein the step of forming the doped polysilicon layer on the cell contact comprises performing an in situ-doped deposition on the cell contact to form the doped polysilicon layer.

17. The method of claim 13, wherein the first cleaning treatment is performed for 0.75 minute to 2 minutes.

18. The method of claim 13, wherein the second cleaning treatment is performed for 0.2 minute to 1.5 minute.

19. The method of claim 18, wherein the second cleaning treatment is performed for 0.2 minute to 0.75 minute when the second cleaning treatment is performed by the diluted hydrofluoric acid, and the second cleaning treatment is performed for 0.75 minute to 1.5 minute when the second cleaning treatment is performed by the water.

20. The method of claim 13, further comprising forming a barrier layer on the cell contact structure, the bit line structure and the spacer.

* * * * *